United States Patent
Huang et al.

(10) Patent No.: US 10,833,691 B1
(45) Date of Patent: Nov. 10, 2020

(54) SIGNAL CHOPPING SWITCH CIRCUIT WITH SHARED BOOTSTRAP CAPACITOR

(71) Applicant: BAE Systems Information and Electronic Systems Integration Inc., Nashua, NH (US)

(72) Inventors: Cameron Huang, Manchester, NH (US); Randall M. White, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/696,463

(22) Filed: Nov. 26, 2019

(51) Int. Cl.
*H03M 1/10* (2006.01)

(52) U.S. Cl.
CPC .................... *H03M 1/1033* (2013.01)

(58) Field of Classification Search
CPC ............... H03M 1/12; H03M 1/1033
USPC .......................................... 341/155, 120, 118
See application file for complete search history.

(56) References Cited

U.S. PATENT DOCUMENTS

| 8,963,630 B2 * | 2/2015 | Ceballos | H03F 3/45475 |
| | | | 327/337 |
| 2019/0081601 A1 * | 3/2019 | Hurwitz | H03M 1/466 |

* cited by examiner

*Primary Examiner* — Peguy Jean Pierre
(74) *Attorney, Agent, or Firm* — Finch & Maloney PLLC

(57) ABSTRACT

An analog to digital converter is disclosed that is designed to receive a differential analog signal and includes a signal chopping circuit and a successive approximation register (SAR) coupled to the signal chopping circuit. The signal chopping circuit is designed to invert a polarity of the differential analog signal and includes a first switching circuit having a first transistor and a second switching circuit having a second transistor. A gate of the first transistor and a gate of the second transistor is each coupled to a same bootstrap capacitor. Coupling both switching circuits to the same bootstrap capacitor (as opposed to separate bootstrap capacitors) greatly frees up space on the die or chip.

20 Claims, 9 Drawing Sheets

US 10,833,691 B1

SIGNAL CHOPPING SWITCH CIRCUIT WITH SHARED BOOTSTRAP CAPACITOR

BACKGROUND

Analog-to-digital converters (ADCs) are widely used in communication systems to process incoming radio frequency (RF) signals. Time-interleaved ADC architectures typically require calibration to reduce the effect of channel mismatches in the offset voltage. Some architectures utilize a signal chopping circuit to obtain zero-mean offset and other useful functionality when implementing on-line calibration routines for the ADC. Furthermore, bootstrapping is another commonly used technique to improve the linearity and drive of switch-based ADCs. However, bootstrapping requires additional area and power due to large bootstrap capacitors. To these ends, there are a number of non-trivial issues associated with developing ADC architectures.

BRIEF DESCRIPTION OF THE DRAWINGS

Features and advantages of embodiments of the claimed subject matter will become apparent as the following Detailed Description proceeds, and upon reference to the Drawings, in which:

Figure 1:
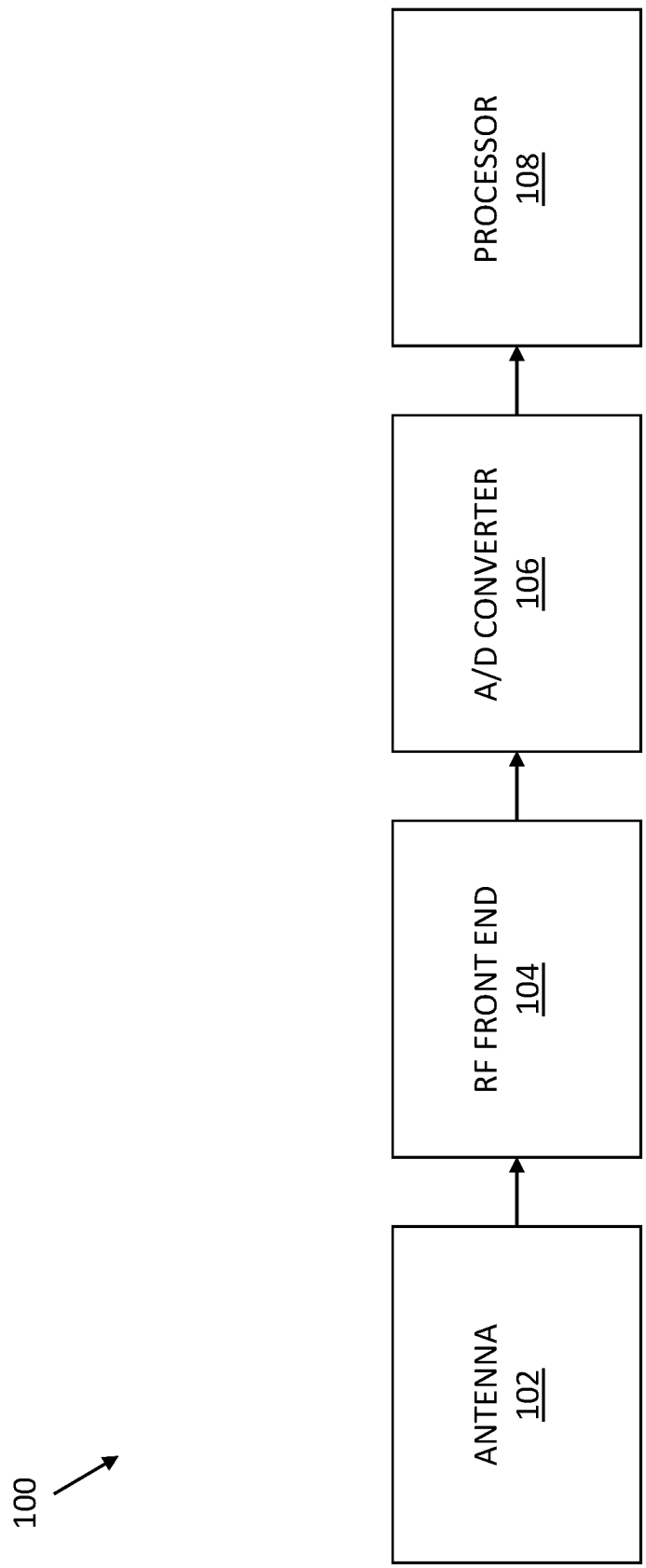
FIG. 1 illustrates a block diagram of an RF receiver system, in accordance with an embodiment of the present disclosure.

Although the following Detailed Description will proceed with reference being made to illustrative embodiments, many alternatives, modifications, and variations thereof will be apparent in light of this disclosure.

DETAILED DESCRIPTION

An analog to digital converter (ADC) is disclosed that is designed to receive a differential analog signal. In an embodiment, the ADC includes a signal chopping circuit and a successive approximation register (SAR) coupled to the signal chopping circuit. The signal chopping circuit is designed to invert a polarity of the differential analog signal and includes a first switching circuit having a first transistor and a second switching circuit having a second transistor. A gate of the first transistor and a gate of the second transistor are each coupled to the same bootstrap capacitor. Coupling both switching circuits to a shared bootstrap capacitor (as opposed to separate bootstrap capacitors for each switching circuit) greatly frees up space on the chip. Other advantages and embodiments will be apparent in light of this disclosure.

General Overview

As noted above, there are a number of non-trivial issues associated with developing SAR-based ADCs. Asynchronous SAR-based ADC architectures allow for very high sampling rates at a low overall power consumption. The SAR units within the ADC are each configured to sample a portion of an input differential analog signal and convert the sampled analog signal into an equivalent digital signal using known successive approximation techniques. Multiple SAR units may be time-interleaved to operate in parallel, thus increasing the overall sample rate of the ADC. Switches are used to control the timing of the input analog signal to each of the SAR units. The switches can be implemented with signal chopping functionality to allow for the polarity of the input analog signal to be switched. Such functionality can be useful, for example, for calibrating the ADC. However, achieving consistent and reliable switching times amongst all of the switches can be challenging, given that some signals may be switched faster than others, depending on factors such as signal path length. To achieve better linearity across the switching circuits, bootstrapping circuitry may be used. With such an approach, each switch circuit is coupled to a bootstrap circuit including one or more capacitors. These capacitors tend to be large, requiring additional area and power consumption for the overall design.

Thus, signal chopping circuitry configured with a shared bootstrap circuit is provided herein. For example, standard signal chopping circuits use two switching circuits per analog input (a total of four switching circuits for the differential analog input), which would require four bootstrapping capacitors (i.e., one for each of the switching circuits to ensure consistent switching times). However, as noted above, such a configuration may not be practical due to, among other things, size constraints. Thus, to reduce the number of bootstrap capacitors, pairs of switching circuits are combined and use the same bootstrapping capacitor to half the total number of bootstrapping capacitors, in accordance with some embodiments. In still other embodiments, it is possible to combine more than two switching circuits such that each of the combined switching circuits share the same bootstrapping capacitor, so as to reduce bootstrap capacitor count even further. Although embodiments herein are disclosed with reference to an ADC, it should be understood that such embodiments may also be utilized in any electronic device that receives a differential analog signal. In a more general sense, the techniques provided herein can be used with any chopping circuit that could be coupled with a shared bootstrap circuitry as variously provided herein.

In one specific embodiment, an ADC includes a differential analog input designed to receive a differential analog signal, a signal chopping circuit coupled to the differential analog input, and a successive approximation register (SAR) coupled to the signal chopping circuit. The signal chopping circuit is designed to invert a polarity of the differential analog signal and includes a first switching circuit having a first transistor and a second switching circuit having a second transistor. A gate of the first transistor and a gate of the second transistor is each coupled to the same bootstrap capacitor. Since the bootstrap capacitor can be relatively large, coupling more than one switching circuit to the same bootstrap capacitor (as opposed to separate bootstrap capacitors) greatly frees up space for implementing the signal chopping circuit.

In another embodiment, a signal chopping circuit receives an analog voltage at an analog input and switches between a first analog output and a second analog output. The signal chopping circuit includes a first switching transistor coupled to the analog input and the first analog output, a second switching transistor coupled to the analog input and the second analog output, and a bootstrap capacitor coupled to a pull-up network of transistors and to a pull-down network of transistors. The bootstrap capacitor is further coupled to a gate of the first switching transistor and a gate of the second switching transistor. The pull-up and pull-down transistor networks are used to pre-charge the bootstrap capacitor before it is used to apply voltage to the gate of either the first switching transistor or the second switching transistor based on synchronized clock signals, as will be further discussed herein.

Numerous variations and alternative embodiments will be appreciated in light of this disclosure. The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

Moreover, note that reference to transistor features such as gate, source, or drain is not intended to exclude any transistor technologies. For instance, features such as source, drain, and gate are typically used to refer to a field effect transistor (FET), while emitter, collector, and base are typically used to refer to a bipolar junction transistor (BJT). Such features may be used interchangeably herein, as will be appreciated. For instance, reference to the gate of a transistor may also be understood to refer to either the gate of a FET or the base of a BJT, and vice-versa. Any other suitable transistor technologies can be used. As will be further appreciated, any such transistors can be used as a switch, with the gate or base or other comparable feature acting as a switch select input that can be driven to connect the source and drain (or the emitter and collector, as the case may be).

RF Receiver Overview

FIG. 1 illustrates an example RF receiver (or transceiver) 100, according to an embodiment. RF system 100 includes an antenna 102, RF front end circuitry 104, an ADC 106, and a processor 108. In some cases, RF receiver 100 is implanted as a system-on-chip, or a chip set populated on a printed circuit board (PCB) which may in turn be populated into a chassis of a multi-chassis system or an otherwise higher-level system, although any number of implementations can be used. RF receiver 100 may be one portion of an electronic device that sends and/or receives RF signals.

Antenna 102 may include one or more patch antennas or microstrip antennas, according to some embodiments. Any number of antennas may be included in antenna 102. In some embodiments, antenna 102 may include one or more antennas to support multiple communication bands (e.g., dual band operation or tri-band operation). For example, some of the antennas may support tri-band operation at 28 gigahertz, 39 gigahertz, and 60 gigahertz. Various ones of the antennas may support tri-band operation at 24.5 gigahertz to 29 gigahertz, 37 gigahertz to 43 gigahertz, and 57 gigahertz to 71 gigahertz. Various ones of the antennas may support 5G communications and 60 gigahertz communications. Various ones of the antennas may support 28 gigahertz and 39 gigahertz communications. Various ones of the antennas may support millimeter wave communications. Various ones of the antennas may support high band frequencies and low band frequencies. In a more general sense, antenna 102 may be any number of antenna types and configurations suitable for receiving (and possibly transmitting) desired communication signals, as will be appreciated.

RF front end circuitry 104 may include various components that are designed to filter, amplify, and tune selected portions of a received RF signal, according to an embodiment. RF front end circuitry may be designed to have a high dynamic range that can tune across a wide bandwidth of frequencies. For example, RF front end circuitry 104 may include components that are capable of tuning to particular frequency ranges within a signal having a bandwidth in the gigahertz range, such as bandwidths between 5 GHz and 50 GHz.

ADC 106 may be implemented to receive a filtered, amplified RF signal from RF front end circuitry and to convert the signal into a digital signal for further processing. In some embodiments, ADC 106 is implemented as an asynchronous SAR-based ADC. Time interleaving techniques using switches across multiple SAR units can be used to further enhance the sample rate of ADC 106. In some embodiments, ADC 106 has a sample rate of around 4 giga samples per second (Gsps), and an output resolution of around 8 bits, although the present disclosure is not intended to be limited to such specific implementation details. Further details regarding the design of ADC 106, including embodiments configured with a signal chopper topology that includes a bootstrap capacitor that is shared among multiple switching circuits, will be discussed in turn.

Processor 108 may be configured to receive the digitized signal and perform any number of operations with the signal. For example, processor 108 may look for particular patterns or signatures in the received digital signal. As used herein, the term "processor" may refer to any device or portion of a device that processes electronic data from registers and/or memory to transform that electronic data into other electronic data that may be stored in registers and/or memory. Processor 108 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, custom-built semiconductor, or any other suitable processing devices.

SAR-Based ADC

Figure 2:
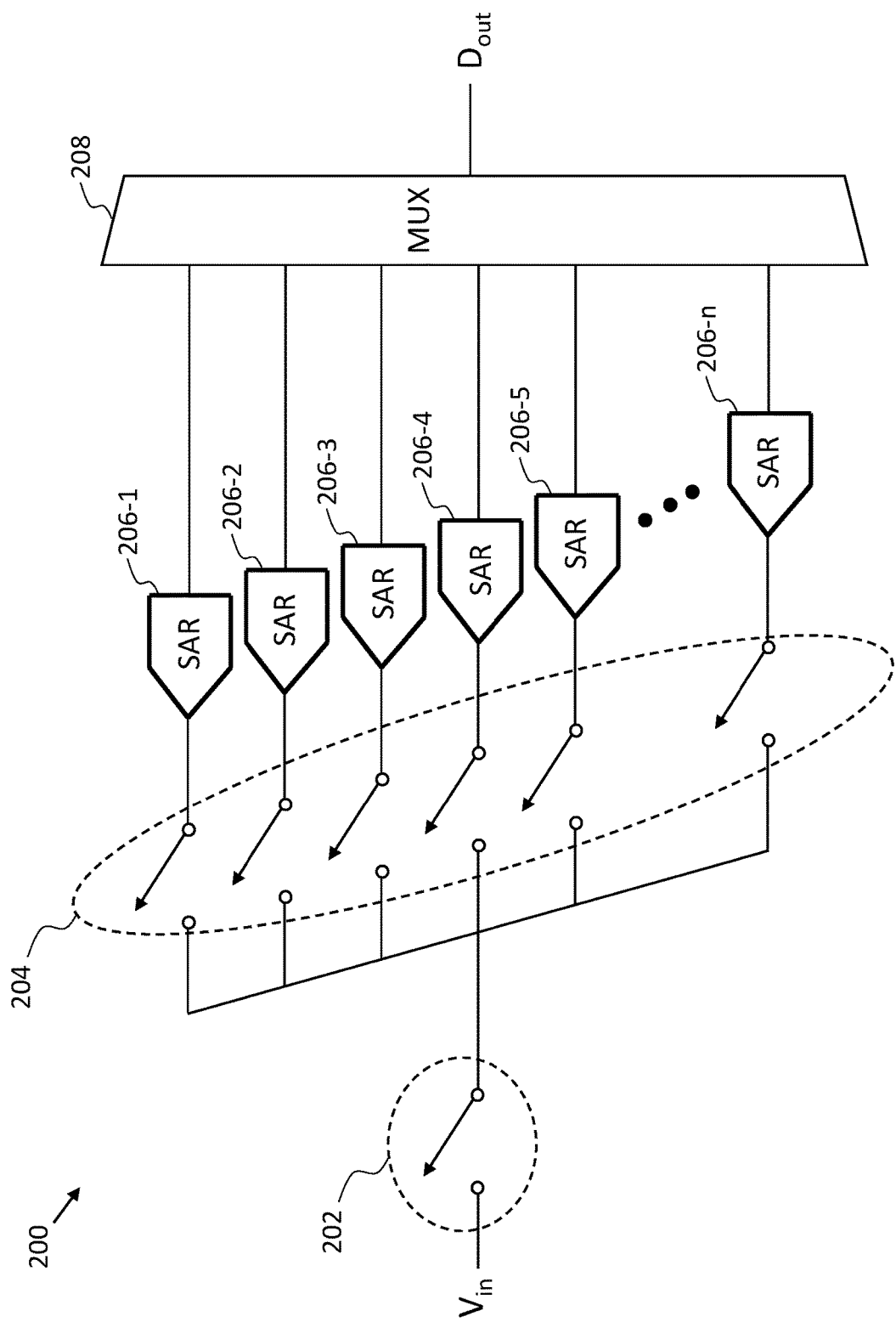
FIG. 2 illustrates a schematic diagram of a time-interleaved ADC architecture, in accordance with an embodiment of the present disclosure.

FIG. 2 illustrates an example time-interleaved ADC unit 200, according to an embodiment. ADC unit 200 receives an input analog voltage Vt. and samples the input voltage using a first sampling switch 202 having a sample rate between about 2 Gsps and about 8 Gsps. In one example, the sample rate is 4 Gsps. A plurality of additional sampling switches 204 are used to provide multiple time-interleaved channels, each with its own SAR unit 206-1-206-$n$ for converting the sampled voltage to a digital signal. The converted digital signals are fed from each SAR unit 206-1 to 206-$n$ to a multiplexing unit 208 where they can ultimately be fed out as digital output $D_{out}$.

In one example, 16 time-interleaved channels are used to provide the aggregate conversion rate of 4 Gsps. Each of the 16 channels samples at $\frac{1}{16}$ the aggregate rate (i.e., 250 Msps) At its nominal operating point, according to this example, time-interleaved ADC unit 200 consumes about 625 uW of power, which extrapolates to a power dissipation of 10 mW for the full 16x interleaved channels. The energy efficiency of this design can scale favorably if ported to an advanced node combinatorial metal-oxide-semiconductor (CMOS) technology such as 22FDX.

During its corresponding sample time, each SAR unit 206-1 to 206-n receives a differential input voltage and stores the voltage across a bank of capacitors. Thus, while other channels are being sampled, the stored voltage can be converted to a digital signal allowing for asynchronous operation across the SAR units. Briefly, the differential voltage is compared to itself (i.e., $V_{in}^+$ compared against $V_{in}^-$) to determine the value of the first digital bit. Then, whichever voltage is higher ($V_{in}^+$ or $V_{in}^-$) is halved and the comparison is made again for the next digital bit. This process repeats until all digital bits have been set.

Figure 3:
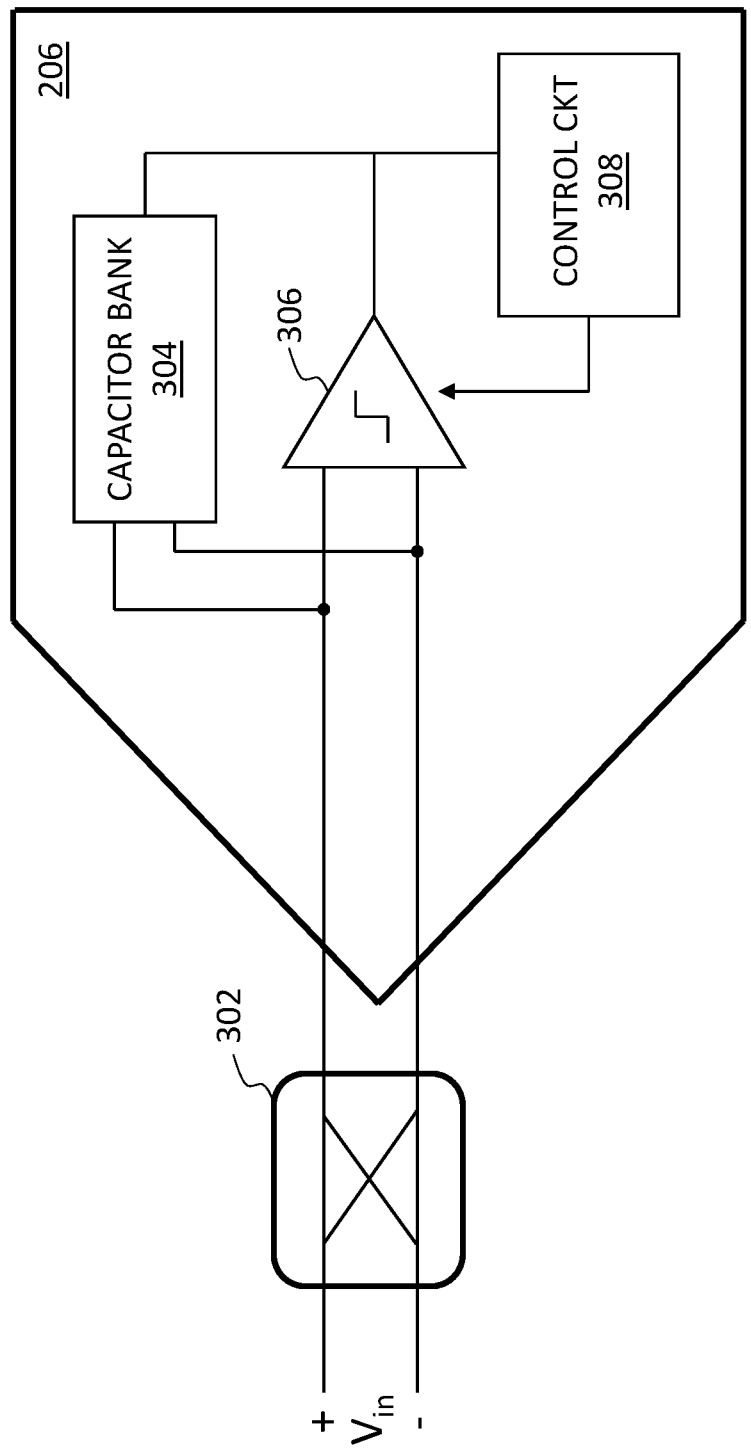
FIG. 3 illustrates a schematic diagram of a successive approximation unit (SAR) with the ADC architecture of FIG. 2, in accordance with an embodiment of the present disclosure.

FIG. 3 illustrates a more detailed illustration of a SAR unit 206, according to an embodiment. A sampled portion of $V_{in}$ is first received by a signal chopping circuit 302 before being fed to SAR unit 206. Signal chopping circuit 302 may represent any one of sampling switches 204 present on any one of the signal channels. Signal chopping circuit 302 acts as a switch between $V_{in}$ and SAR unit 206 and further includes the capability of switching the polarity of $V_{in}$ before it is received by SAR unit 206. The ability to switch the polarity of the incoming differential voltage on each channel is useful for calibrating the ADC unit 200.

Inside each SAR unit 206 is at least a capacitor bank 304, a comparator 306, and a control circuit 308, according to some embodiments. The differential input voltage is stored within capacitor bank 304 and also compared at comparator 306. While other channels are being sampled, the higher voltage of the stored differential voltage is halved and the comparison continues as discussed above. Control circuit 308 may be provided to control the operation of comparator 306 and the value of the voltages stored in capacitor bank 304. In some embodiments, the output of comparator 306 after each comparison (logic level '1' or '0') is stored within a digital register until all bits have been determined.

The following example is provided to illustrate the operation of SAR unit 206. The differential voltage $V_{in}$ may swing between +1 V and −1 V. In a case where the sampled differential voltage $V_{in}$=200 mV, this is equivalent to $V_{in}^+$ =600 mV and $V_{in}^-$=400 mV, since $V_{in}=V_{in}^+-V_{in}^-$. The most significant bit is determined first by comparing the differential voltage $V_{in}^+$ to $V_{in}^-$. $V_{in}^+$ is greater, so the most significant bit is set to '1'. Then Vin+ is halved to 300 mV and the comparison is performed again to determine the next bit. This time, $V_{in}^-$ is greater than $V_{in}^+$, so the next bit is set to '0' and $V_{in}^-$ is halved so that $V_{in}^+$=300 mV and $V_{in}^+$=200 mV. The process continues for the desired resolution (for example, to provide an 8-bit digital output).

Figure 4:
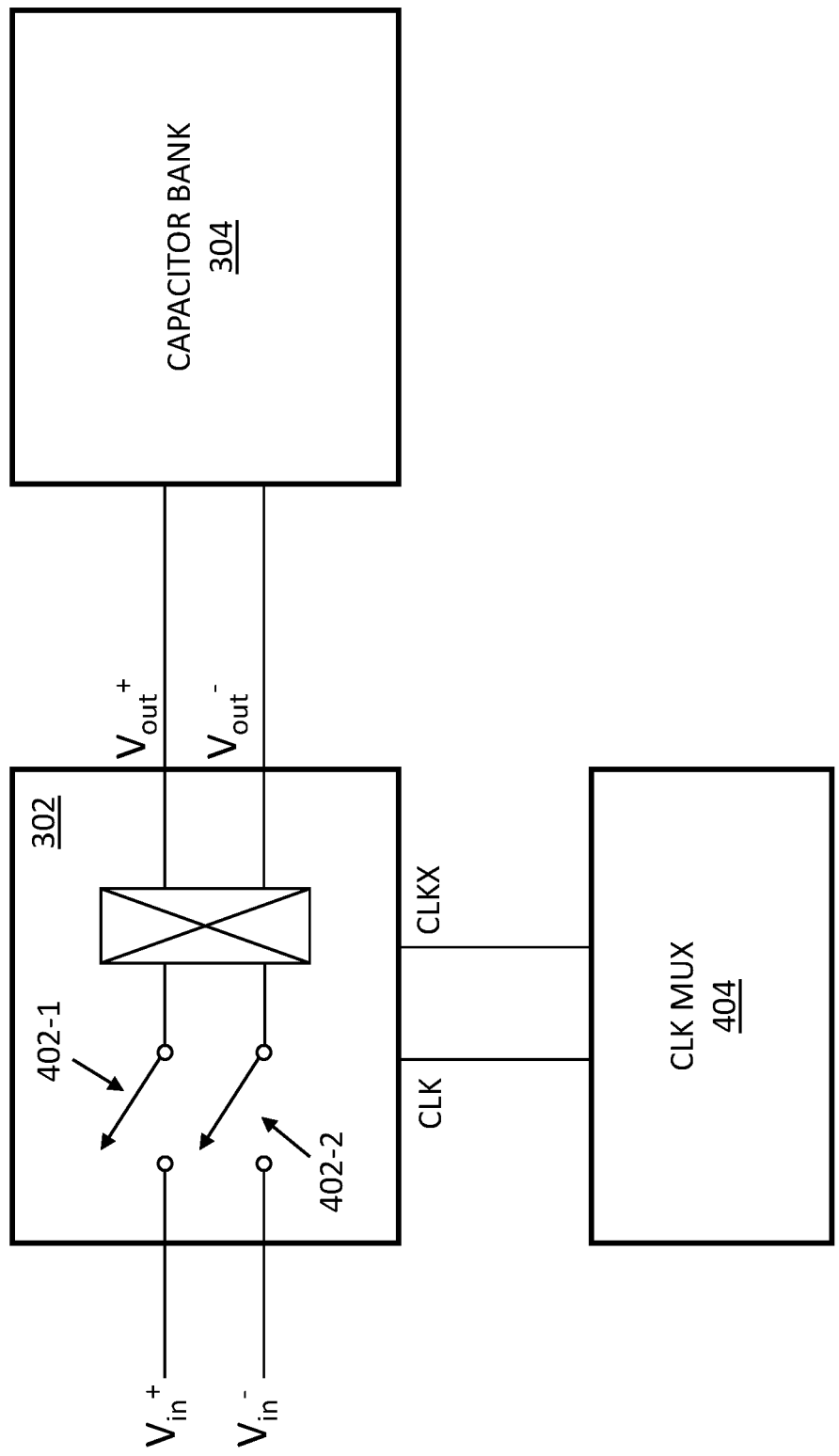
FIG. 4 illustrates a schematic diagram showing inputs and outputs for a signal chopper circuit, in accordance with an embodiment of the present disclosure.

As noted above, each of sampling switches 204 may be implemented as a signal chopping switch. The signal chopping switch may be designed to receive two different clock signals having a substantially symmetrical delay. That is, while the first clock signal is high, the other clock signal is simultaneously low, and vice versa. It should be understood that the term "substantially" in this context, and as used herein, can refer to a very small offset (e.g. on the order of femtoseconds) between the switching times of the two clock signals, such that the application is not affected. FIG. 4 illustrates signal chopping switch 302 having a first internal switching circuit 402-1 coupled to $V_{in}^+$ and a second internal switching circuit 402-2 coupled to $V_{in}^-$. Each of first internal switching circuit 402-1 and second internal switching circuit 402-2 controls whether its corresponding input is provided to the output $V_{out}^+$ or $V_{out}^-$.

According to an embodiment, a clock multiplexer 404 is used to provide sampling pulses on either CLK input or CLKX input. In some embodiments, the clock signals provided on CLK and CLKX have substantially equal propagation delay so as to maintain consistent timing among all of the signal chopping switches regardless of whether CLK or CLKX is used. First internal switching circuit 402-1 and second internal switching circuit 402-2 determine the output path of their corresponding inputs based on whether CLK or CLKX is currently active.

Figure 5:
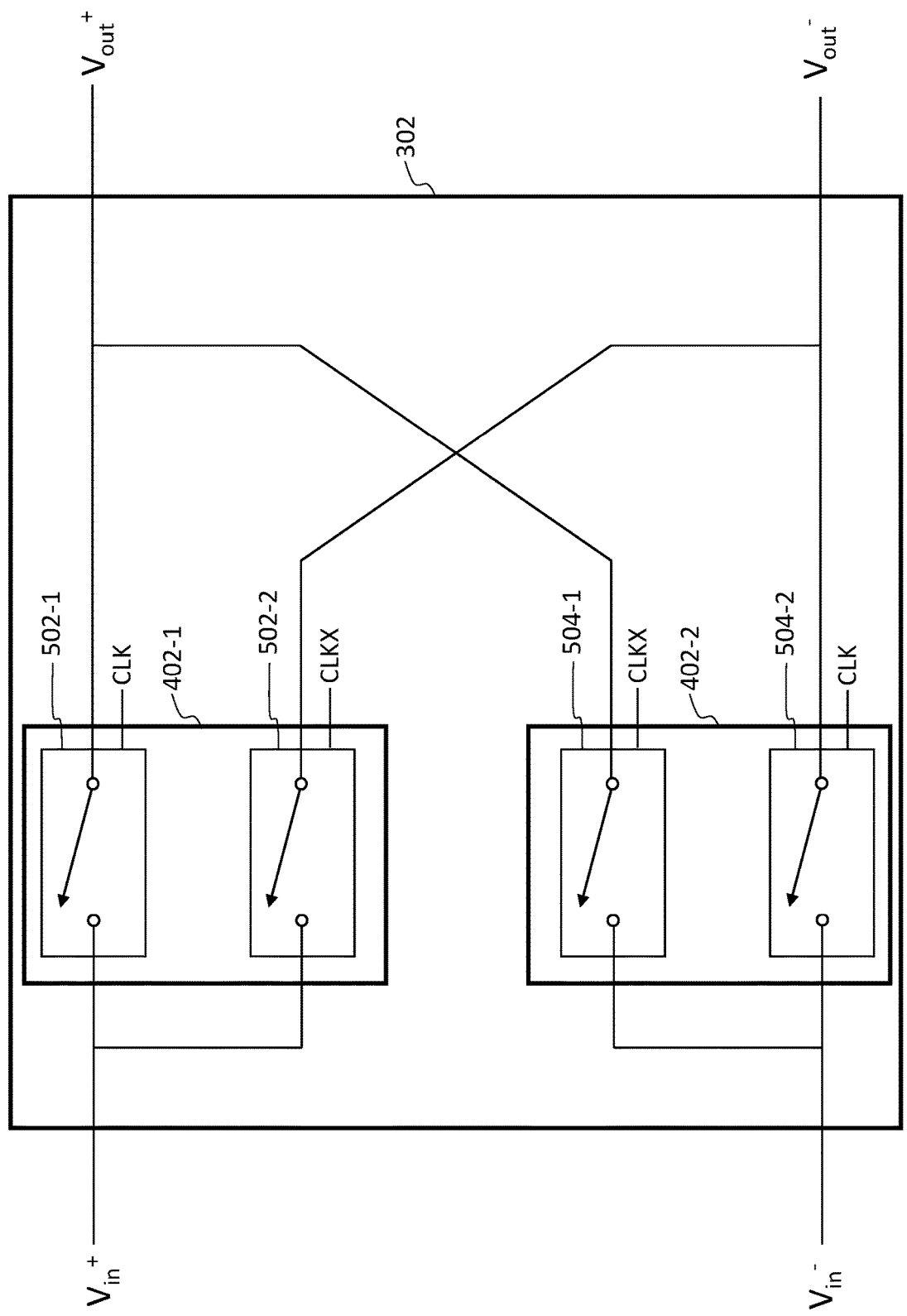
FIG. 5 illustrates a schematic diagram showing a more detailed operation of the signal chopper circuit from FIG. 4, in accordance with an embodiment of the present disclosure.

FIG. 5 illustrates a more detailed schematic of signal chopping switch 302 showing how the CLK and CLKX inputs are used. First internal switching circuit 402-1 includes a first switch 502-1 and a second switch 502-2. According to an embodiment, first switch 502-1 is activated in accordance with the CLK input while second switch 502-2 is activated in accordance with the CLKX input. Similarly, second internal switching circuit 402-2 includes a third switch 504-1 and a fourth switch 504-2. According to an embodiment, third switch 504-1 is activated in accordance with the CLKX input while fourth switch 504-2 is activated in accordance with the CLK input. It should be understood that either of first internal switching circuit 402-1 and second internal switching circuit 402-2 can be referred to also as a signal chopping circuit.

When first internal switching circuit 402-1 and second internal switching circuit 402-2 receive clock pulses on the CLK input, $V_{in}^+=V_{out}^+$ and $V_{in}^-=V_{out}^-$ and the CLKX inputs are grounded. On the other hand, when first internal switching circuit 402-1 and second internal switching circuit 402-2 receive clock pulses on the CLKX input, $V_{in}^+=V_{out}^-$ and $V_{in}^-=V_{out}^+$ and the CLK inputs are grounded.

In a conventional configuration, each of first switch 502-1 and second switch 502-2 would include its own bootstrap capacitor to ensure consistent switching times regardless of the value of $V_{in}^+$. The bootstrap capacitor is pre-charged to a VDD rail voltage before the switching operation occurs, then is also configured to be charged with the additional $V_{in}^+$ voltage during switching. The charged bootstrap capacitor is configured to apply its voltage (VDD+$V_{in}^+$) to a gate of a switching transistor that receives $V_{in}^+$ and outputs to either $V_{out}^+$ or $V_{out}^-$. By applying the $V_{in}^+$ voltage to the gate of the switching transistor, the $V_{GS}$ voltage applied to the switching transistor remains consistent (i.e., VDD) regardless of the value of $V_{in}^+$ because the $V_{in}^+$ is applied to the source terminal of the switching transistor. Although bootstrapping is a useful technique, it requires the use of large capacitors and thus can limit the size and complexity of some circuits.

Figure 6:
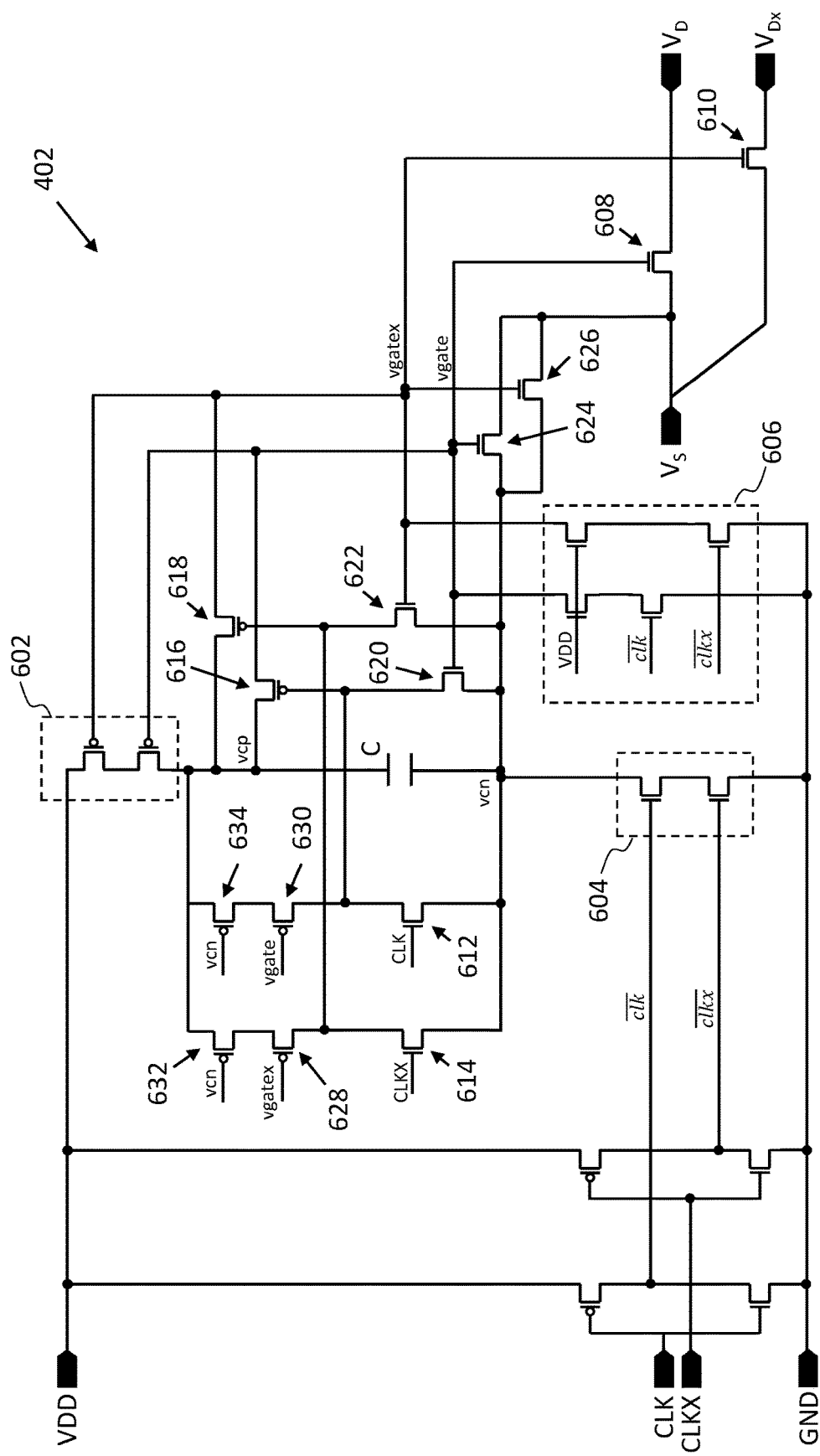
FIG. 6 illustrates a circuit diagram for a portion of the signal chopper circuit from FIG. 4, in accordance with an embodiment of the present disclosure.

According to an embodiment, a new signal chopping circuit is proposed that uses a same shared bootstrap capacitor between two switching circuits that still provide the signal chopping functionality. FIG. 6 illustrates a circuit schematic of internal switching circuit 402 within signal chopping circuit 302, according to an embodiment. Internal switching circuit 402 may represent either first internal switching circuit 402-1 or second internal switching circuit 402-2. $V_S$ receives the input voltage and is thus equal to either $V_{in}^+$ or $V_{in}^-$. When $V_S=V_{in}^+$, $V_D=V_{out}^+$ and $V_{Dx}=V_{out}^-$. Similarly, When $V_S=V_{in}^-$, $V_D=V_{out}^-$ and $V_{Dx}=V_{out}^+$. According to an embodiment, internal switching circuit 402 provides signal chopping functionality (e.g., outputting $V_S$ to either $V_D$ or $V_{Dx}$) and bootstrapping with only a single shared capacitor C.

The capacitor C is charged during a pre-charge phase when both clock inputs CLK and CLKX are grounded. Grounding both clocks turns on the pull-down transistors 604, thus pulling node vcn to ground. The transistors of pull-down transistor network 606 are also all turned on when both clock inputs are grounded, thus turning on the transistors of pull-up network 602. Activating pull-up network 602 pulls the vcp node to VDD voltage, thus charging the capacitor C with the VDD voltage. The size of capacitor C can depend on the sampling frequency being used. In some examples, capacitor C is between 100 fF and 200 fF. Note that during the pre-charge phase, internal switching circuit 402 ensures that the gates of both first switching transistor 608 and second switching transistor 610 are grounded.

Discussion will now be provided for the operation of internal switching circuit 402 upon receiving a HIGH input at the CLK input and upon receiving a HIGH input at the CLKX input. When internal switching circuit 402 is activated using the CLK input, CLKX is grounded. A rising pulse is received at the CLK input, which shuts off both pull-down network 604 and pull-up network 602. At this point, voltage can only be provided to the gates of either first switching transistor 608 or second switching transistor 610 by the charged capacitor C. The high CLK input turns on transistor 612 thus applying the 'LOW' vcn potential to the gate of select transistor 616. This turns on select transistor 616 and allows the voltage on capacitor C to be applied to the gate of first switching transistor 608. It should be noted that while voltage is applied to the gate of first switching transistor 608, the gate of second switching transistor 610 is grounded via pull-down transistor network 606. Applying the voltage of node vcp to the gate of first switching transistor 608 also applies the voltage to the gate of transistor 620 and to the gate of first charging transistor 624, turning it on, and allowing the $V_S$ voltage to also charge capacitor C. Thus, the total voltage across capacitor C during switching is VDD (from the pre-charge)+$V_S$ (the input voltage). Ultimately, the voltage $V_{GS}$ applied to first switching transistor 608 is $V_G$-$V_S$ or (VDD+$V_S$)−($V_S$)=VDD, and this value will always be at or around VDD regardless of the value of $V_S$. The activation of first switching transistor 608 connects the input $V_S$ to the output $V_D$.

In some embodiments, internal switching circuit 402 includes safety transistors 628 and 630 to further ensure that the voltage at the vcp node is NOT applied simultaneously to both gates of first switching transistor 608 and second switching transistor 610. When the vgatex node is pulled to ground via pull-down network 606, it also activates safety transistor 628. Turning on safety transistor 628 applies the vcp node voltage to the gate of select transistor 618, ensuring that it remains off.

When internal switching circuit 402 is activated using the CLKX input, CLK is grounded. A rising pulse is received at the CLKX input, which shuts off both pull-down network 604 and pull-up network 602. At this point, voltage can only be provided to the gates of either first switching transistor 608 or second switching transistor 610 by the charged capacitor C. The high CLKX input turns on transistor 614 thus applying the 'LOW' vcn potential to the gate of select transistor 618. This turns on select transistor 618 and allows the voltage on capacitor C to be applied to the gate of second switching transistor 610. It should be noted that while voltage is applied to the gate of second switching transistor 610, the gate of first switching transistor 608 is grounded via pull-down transistor network 606. Applying the voltage of node vcp to the gate of second switching transistor 610 also applies the voltage to the gate of transistor 622 and to the gate of second charging transistor 626, turning it on, and allowing the $V_S$ voltage to also charge capacitor C. Thus, the total voltage across capacitor C during switching is VDD (from the pre-charge)+$V_S$ (the input voltage). Ultimately, the voltage $V_{GS}$ applied to second switching transistor 610 is $V_G$-$V_S$ or (VDD+$V_S$)−($V_S$)=VDD, and this value will always be at or around VDD regardless of the value of $V_S$. The activation of second switching transistor 610 connects the input $V_S$ to the output $V_{Dx}$. Furthermore, When the gate node is pulled to ground via pull-down network 606, it also activates safety transistor 630. Turning on safety transistor 630 applies the vcp node voltage to the gate of select transistor 616, ensuring that it remains off. In some embodiments, additional safety transistors 632 and 634 are provided and coupled in series with safety transistors 628 and 630, respectively. Additional safety transistors 632 and 634 may be provided to ensure that the maximum voltage across any two terminals of either safety transistors 628 or 630 does not exceed VDD.

Figure 7:
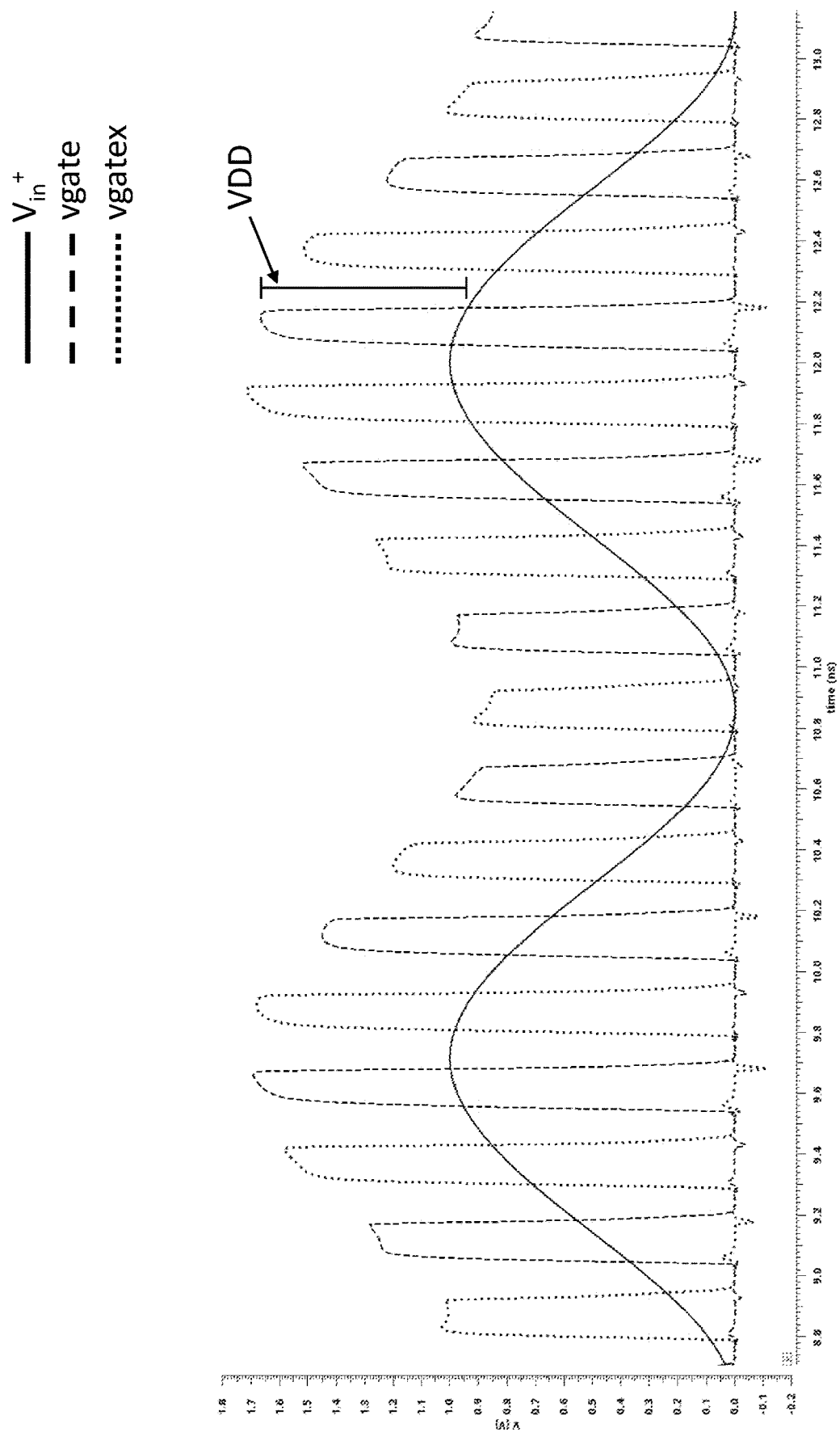
FIG. 7 illustrates simulated gate voltage waveforms on signal chopper switches within the signal chopper circuit from FIG. 4, in accordance with another embodiment of the present disclosure.

FIG. 7 illustrates example simulated waveforms that demonstrate a possible operation of internal switching circuit 402. In this example, $V_{in}^+$ is a sine wave with an amplitude that ranges from 0 V to 1 V. Although not illustrated for clarity, $V_{in}^-$ would be the same sine wave with a phase shift of 180 degrees. In this example, the CLK and CLKX inputs are switched every cycle to show the functionality across the entire input waveform. As can be seen, the voltage applied to vgate follows the changing amplitude of $V_{in}^+$ and is consistently greater than $V_{in}^+$ by the value VDD. Similarly, the voltage applied to vgatex follows the changing amplitude of $V_{in}^+$ and is consistently greater than $V_{in}^+$ by the value VDD. This demonstrates good bootstrapping behavior for internal switching circuit 402.

Figure 8:
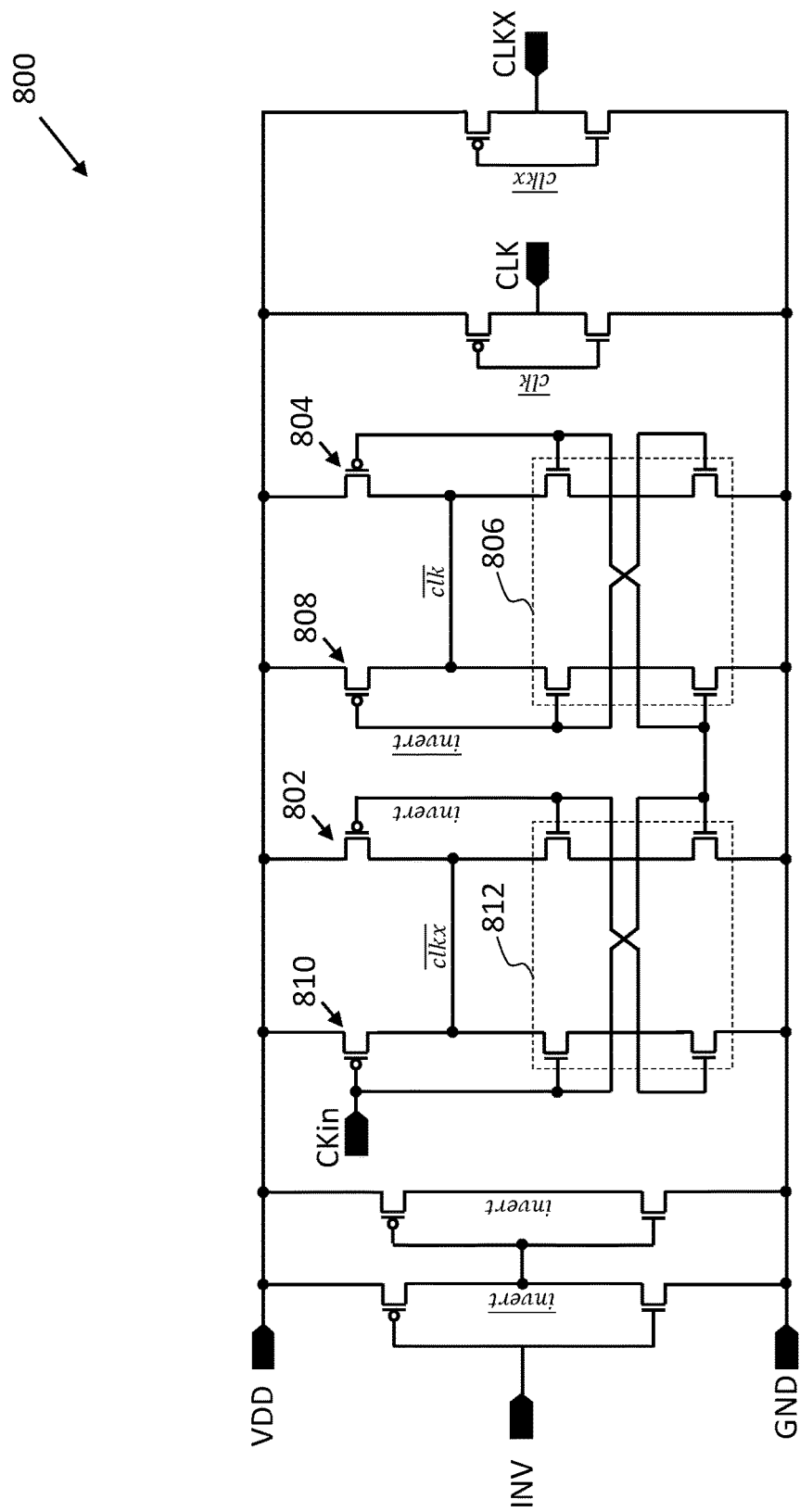
FIG. 8 illustrates a circuit diagram for a portion of the clock multiplexer from FIG. 4, in accordance with an embodiment of the present disclosure.

FIG. 8 illustrates an example clock multiplexer circuit 800 that may be used within clock multiplexer 404. According to some embodiments, clock multiplexer circuit 800 outputs the input clock CKin as either CLK or CLKX based on the value of the INV input. Furthermore, clock multiplexer circuit 800 can switch between using CLK or CLKX with substantially equal propagation delay between the clock output. The CLK and CLKX outputs may be fed to a signal chopper, such as signal chopper circuit 302.

Clock multiplexer circuit 800 is arranged such that the CLK output follows CKin, and CLKX is grounded when the INV value is '0'. Conversely, the CLKX output follows CKin, and CLK is grounded when the INV value is '1'.

When INV value is '0' (e.g., no polarity inversion desired), the invert node is pulled to ground which activates transistor 802. Turning on transistor 802 apples VDD voltage to node $\overline{clkx}$, which grounds the CLKX output. Additionally, the node $\overline{clk}$ follows the inverse of CKin ($\overline{clk}$ is pulled high when CKin is low due to transistor 804, and $\overline{clk}$ is pulled low when CKin is high due to transistor group 806.) Taking the inverse of $\overline{clk}$ provides the CLK output that follows the CKin input.

When INV value is '1' (e.g., polarity inversion is desired), the $\overline{invert}$ node is pulled to ground which activates transistor 808. Turning on transistor 808 apples VDD voltage to node $\overline{clk}$, which grounds the CLK output. Additionally, the node $\overline{clkx}$ follows the inverse of CKin ($\overline{clkx}$ is pulled high when CKin is low due to transistor 810, and $\overline{clkx}$ is pulled low when CKin is high due to transistor group 812.) Taking the inverse of $\overline{clkx}$ provides the CLKX output that follows the CKin input.

Example Communication Device

Figure 9:
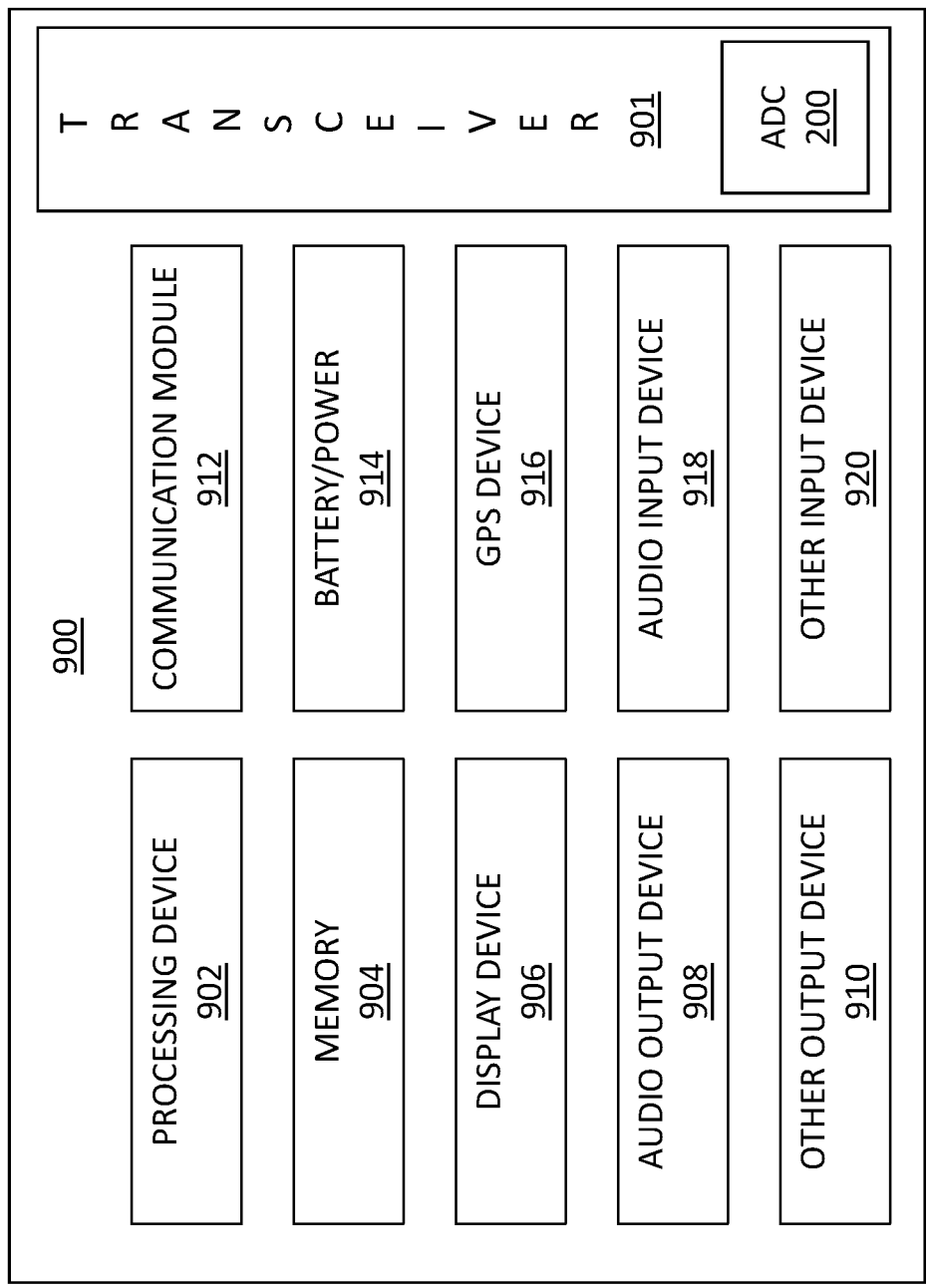
FIG. 9 illustrates a block diagram of an example communication device that may include a time-interleaved ADC, in accordance with an embodiment of the present disclosure.

FIG. 9 is a block diagram of an example communication device 900 that may include a transceiver, that includes an ADC in accordance with any of the embodiments disclosed herein. For example, communication device 900 includes transceiver 901 having ADC 200 for receiving RF signals and converting them to digital signals. ADC 200 may include signal chopping circuits with an improved design that minimizes the number of bootstrap capacitors used, as discussed in some embodiments herein. In some embodiments transceiver 901 is replaced with a receiver having ADC 200. Several components are illustrated in FIG. 6 as included in the communication device 600, but any one or more of these components may be omitted or duplicated, as suitable for the application. In some embodiments, some or all of the components included in the communication device 600 may be attached to one or more motherboards. In some embodiments, some or all of these components are fabricated onto a single system-in-package (SIP).

Additionally, in various embodiments, communication device 900 may not include one or more of the components illustrated in FIG. 9, but communication device 900 may include interface circuitry for coupling to the one or more components. For example, communication device 900 may not include a display device 906, but may include display device interface circuitry (e.g., a connector and driver circuitry) to which display device 906 may be coupled. In another set of examples, communication device 900 may not include an audio input device 918 or an audio output device 908 but may include audio input or output device interface circuitry (e.g., connectors and supporting circuitry) to which audio input device 918 or audio output device 908 may be coupled.

Communication device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. Communication device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 904 may include memory that shares a die with processing device 902. This memory may be used as cache memory and may include embedded dynamic random access memory (eDRAM) or spin transfer torque magnetic random access memory (STT-MRAM).

In some embodiments, communication device 900 may include a communication module 912 (e.g., one or more communication modules). For example, communication module 912 may be configured for managing wireless communications for the transfer of data to and from communication device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication module 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication module 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication module 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication module 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication module 912 may operate in accordance with other wireless protocols in other embodiments. Communication device 900 may include transceiver 901 to facilitate wireless communications and/or to receive other wireless communications (such as AM or FM radio transmissions).

In some embodiments, communication module 912 may manage wired communications, such as electrical, optical, or any other suitable communication protocols (e.g., the Ethernet). As noted above, communication module 912 may include multiple communication modules. For instance, a first communication module may be dedicated to shorter-range wireless communications such as Wi-Fi or Bluetooth, and a second communication module may be dedicated to longer-range wireless communications such as global positioning system (GPS), EDGE, GPRS, CDMA, WiMAX, LTE, EV-DO, or others. In some embodiments, the first communication module may be dedicated to wireless communications, and the second communication module may be dedicated to wired communications.

Communication device 900 may include battery/power circuitry 914. Battery/power circuitry 914 may include one or more energy storage devices (e.g., batteries or capacitors) and/or circuitry for coupling components of communication device 900 to an energy source separate from communication device 900 (e.g., AC line power).

Communication device 900 may include a display device 906 (or corresponding interface circuitry, as discussed above). Display device 906 may include any visual indicators, such as a heads-up display, a computer monitor, a projector, a touchscreen display, a liquid crystal display (LCD), a light-emitting diode display, or a flat panel display.

Communication device 900 may include an audio output device 908 (or corresponding interface circuitry, as discussed above). Audio output device 908 may include any device that generates an audible indicator, such as speakers, headsets, or earbuds.

Communication device 900 may include audio input device 918 (or corresponding interface circuitry, as discussed above). Audio input device 918 may include any device that generates a signal representative of a sound, such as microphones, microphone arrays, or digital instruments (e.g., instruments having a musical instrument digital interface (MIDI) output).

Communication device 900 may include a GPS device 916 (or corresponding interface circuitry, as discussed above). GPS device 916 may be in communication with a satellite-based system and may receive a location of communication device 900, as known in the art.

Communication device 900 may include an-other output device 910 (or corresponding interface circuitry, as discussed above). Examples of other output device 910 may include an audio codec, a video codec, a printer, a wired or wireless transmitter for providing information to other devices, or an additional storage device.

Communication device 900 may include an-other input device 920 (or corresponding interface circuitry, as discussed above). Examples of other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Communication device 900 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 900 may be any other electronic device that processes data.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Further Example Embodiments

The following examples pertain to further embodiments, from which numerous permutations and configurations will be apparent.

Example 1 is an analog-to-digital converter (ADC) that includes a differential analog input configured to receive a differential analog signal, a signal chopping circuit coupled to the differential analog input, and a successive approximation register (SAR) coupled to the signal chopping circuit. The signal chopping circuit inverts a polarity of the differential analog signal, and includes a first switching circuit, a second switching circuit, and a bootstrap capacitor. The first switching circuit has a first transistor and the second switching circuit has a second transistor, and a gate of the first transistor and a gate of the second transistor is each coupled to the bootstrap capacitor.

Example 2 includes the subject matter of Example 1, wherein the SAR comprises a bank of capacitors and a comparator circuit coupled to the bank of capacitors and to the differential analog input.

Example 3 includes the subject matter of Example 1 or 2, wherein the bootstrap capacitor has a capacitance between 100 fF and 200 fF.

Example 4 includes the subject matter of any one of Examples 1-3, wherein the bootstrap capacitor is configured to be charged up to a first voltage, and wherein the gate of the first transistor is configured to receive the first voltage while the gate of the second transistor is grounded, and wherein the gate of the second transistor is configured to receive the first voltage while the gate of the first transistor is grounded.

Example 5 includes the subject matter of any one of Examples 1-4, wherein the signal chopping circuit is one of a plurality of signal chopping circuits, and the SAR is one of a plurality of SARs coupled to corresponding ones of the plurality of signal chopping circuits.

Example 6 includes the subject matter of Example 5, further comprising a multiplexer coupled to outputs of each of the plurality of SARs.

Example 7 includes the subject matter of any one of Examples 1-6, wherein the bootstrap capacitor is a first bootstrap capacitor, and wherein the signal chopping circuit comprises a third switching circuit having a third transistor and a fourth switching circuit having a fourth transistor, wherein a gate of the third transistor and a gate of the fourth transistor is each coupled to a same second bootstrap capacitor.

Example 8 includes the subject matter of Example 7, wherein the first transistor and the second transistor are configured to receive a positive input from the differential analog signal, and the third transistor and the fourth transistor are configured to receive a negative input from the differential analog signal.

Example 9 includes the subject matter of any one of Examples 1-8, wherein the signal chopping circuit is configured to receive a first clock signal and a second clock signal.

Example 10 includes the subject matter of Example 9, wherein the first clock signal and the second clock signal have a symmetrical delay.

Example 11 is a signal chopping circuit configured to receive an analog voltage at an analog input and switch between a first analog output and a second analog output. The signal chopping circuit includes a first switching circuit coupled to the analog input and the first analog output, a second switching circuit coupled to the analog input and the second analog output, a pull-up circuit including one or more transistors, a pull-down circuit including one or more transistors, and a bootstrap capacitor coupled to the pull-up circuit and to the pull-down circuit. The first switching circuit includes a switch select input for changing switch position of the first switching circuit and the second switching circuit includes a switch select input for changing switch position of the second switching circuit. The bootstrap capacitor is further coupled to the switch select input of the first switching circuit and the switch select input of the second switching circuit.

Example 12 includes the subject matter of Example 11, wherein the bootstrap capacitor has a capacitance between 100 fF and 200 fF.

Example 13 includes the subject matter of Example 11 or 12, wherein the switch select input of the first switching circuit includes a first transistor gate, and the switch select input of the second switching circuit includes a second transistor gate, and wherein the bootstrap capacitor is configured to be charged up to a first voltage, and wherein the first transistor gate of the first switching circuit is configured to receive the first voltage while the second transistor gate of the second switching circuit is grounded, and wherein the second transistor gate of the second switching circuit is configured to receive the first voltage while the first transistor gate of the first switching circuit is grounded.

Example 14 includes the subject matter of any one of Examples 11-13, further comprising a first clock input and a second clock input.

Example 15 includes the subject matter of Example 14, wherein a first clock signal received on the first clock input and a second clock signal received on the second clock input have a symmetrical delay.

Example 16 includes the subject matter of any one of Examples 11-15, further comprising one or more charging transistors coupled to the analog input, wherein activation of any one of the one or more charging transistors causes the bootstrap capacitor to be additionally charged with the analog voltage.

Example 17 includes the subject matter of any one of Examples 11-16, further comprising a first select transistor coupled between the bootstrap capacitor and the switch select input of the first switching circuit and a second select transistor coupled between the bootstrap capacitor and the switch select input of the second switching circuit.

Example 18 includes the subject matter of Example 17, further comprising a first safety transistor coupled to the first select transistor and a second safety transistor coupled to the second select transistor, wherein a gate of the first safety transistor is coupled to the switch select input of the first switching circuit and a gate of the second safety transistor is coupled to the switch select input of the second switching circuit.

Example 19 is a communication device that includes a receiver comprising an antenna and configured to receive an RF signal, an analog-to-digital converter (ADC) coupled to the receiver, and a processor coupled to the ADC. The ADC includes at least one signal chopping circuit configured to receive at least a portion of the RF signal. The signal chopping circuit includes a first switching transistor coupled to an input of the signal chopping circuit and to a first output of the signal chopping circuit, a second switching transistor coupled to the input of the signal chopping circuit and to a second output of the signal chopping circuit, and a bootstrap capacitor coupled to a pull-up network of transistors and to a pull-down network of transistors and coupled to a gate of the first switching transistor and a gate of the second switching transistor.

Example 20 includes the subject matter of Example 19, wherein the communication device is part of a system-on-chip or chip set.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:
1. An analog-to-digital converter (ADC), comprising:
   a differential analog input configured to receive a differential analog signal;
   a signal chopping circuit coupled to the differential analog input and configured to invert a polarity of the differential analog signal, the signal chopping circuit including a first switching circuit, a second switching circuit, and a bootstrap capacitor, the first switching circuit having a first transistor and the second switching circuit having a second transistor, wherein a gate of the first transistor and a gate of the second transistor is each coupled to the bootstrap capacitor; and
   a successive approximation register (SAR) coupled to the signal chopping circuit.

2. The ADC of claim 1, wherein the SAR comprises a bank of capacitors and a comparator circuit coupled to the bank of capacitors and to the differential analog input.

3. The ADC of claim 1, wherein the bootstrap capacitor has a capacitance between 100 fF and 200 fF.

4. The ADC of claim 1, wherein the bootstrap capacitor is configured to be charged up to a first voltage, and wherein the gate of the first transistor is configured to receive the first voltage while the gate of the second transistor is grounded, and wherein the gate of the second transistor is configured to receive the first voltage while the gate of the first transistor is grounded.

5. The ADC of claim 1, wherein the signal chopping circuit is one of a plurality of signal chopping circuits, and the SAR is one of a plurality of SARs coupled to corresponding ones of the plurality of signal chopping circuits.

6. The ADC of claim 5, further comprising a multiplexer coupled to outputs of each of the plurality of SARs.

7. The ADC of claim 1, wherein the bootstrap capacitor is a first bootstrap capacitor, and wherein the signal chopping circuit comprises a third switching circuit having a third transistor and a fourth switching circuit having a fourth transistor, wherein a gate of the third transistor and a gate of the fourth transistor is each coupled to a same second bootstrap capacitor.

8. The ADC of claim 7, wherein the first transistor and the second transistor are configured to receive a positive input from the differential analog signal, and the third transistor and the fourth transistor are configured to receive a negative input from the differential analog signal.

9. The ADC of claim 1, wherein the signal chopping circuit is configured to receive a first clock signal and a second clock signal.

10. The ADC of claim 9, wherein the first clock signal and the second clock signal have a substantially symmetrical delay.

11. A signal chopping circuit configured to receive an analog voltage at an analog input and switch between a first analog output and a second analog output, the signal chopping circuit comprising:
a first switching circuit coupled to the analog input and the first analog output, the first switching circuit including a switch select input for changing switch position of the first switching circuit;
a second switching circuit coupled to the analog input and the second analog output, the second switching circuit including a switch select input for changing switch position of the second switching circuit;
a pull-up circuit including one or more transistors;
a pull-down circuit including one or more transistors; and
a bootstrap capacitor coupled to the pull-up circuit and to the pull-down circuit, and also coupled to the switch select input of the first switching circuit and the switch select input of the second switching circuit.

12. The signal chopping circuit of claim 11, wherein the bootstrap capacitor has a capacitance between 100 fF and 200 fF.

13. The signal chopping circuit of claim 11, wherein the switch select input of the first switching circuit includes a first transistor gate, and the switch select input of the second switching circuit includes a second transistor gate, and wherein the bootstrap capacitor is configured to be charged up to a first voltage, and wherein the first transistor gate of the first switching circuit is configured to receive the first voltage while the second transistor gate of the second switching circuit is grounded, and wherein the second transistor gate of the second switching circuit is configured to receive the first voltage while the first transistor gate of the first switching circuit is grounded.

14. The signal chopping circuit of claim 11, further comprising a first clock input and a second clock input.

15. The signal chopping circuit of claim 14, wherein a first clock signal received on the first clock input and a second clock signal received on the second clock input have a substantially symmetrical delay.

16. The signal chopping circuit of claim 11, further comprising one or more charging transistors coupled to the analog input, wherein activation of any one of the one or more charging transistors causes the bootstrap capacitor to be additionally charged with the analog voltage.

17. The signal chopping circuit of claim 11, further comprising a first select transistor coupled between the bootstrap capacitor and the switch select input of the first switching circuit and a second select transistor coupled between the bootstrap capacitor and the switch select input of the second switching circuit.

18. The signal chopping circuit of claim 17, further comprising a first safety transistor coupled to the first select transistor and a second safety transistor coupled to the second select transistor, wherein a gate of the first safety transistor is coupled to the switch select input of the first switching circuit and a gate of the second safety transistor is coupled to the switch select input of the second switching circuit.

19. A communication device, comprising:
a receiver comprising an antenna and configured to receive an RF signal;
an analog-to-digital converter (ADC) coupled to the receiver, wherein the ADC comprises at least one signal chopping circuit configured to receive at least a portion of the RF signal, the signal chopping circuit comprising
a first switching transistor coupled to an input of the signal chopping circuit and to a first output of the signal chopping circuit,
a second switching transistor coupled to the input of the signal chopping circuit and to a second output of the signal chopping circuit, and
a bootstrap capacitor coupled to a pull-up network of transistors and to a pull-down network of transistors and coupled to a gate of the first switching transistor and a gate of the second switching transistor; and
a processor coupled to the ADC.

20. The communication device of claim 19, wherein the communication device is part of a system-on-chip or chip set.

* * * * *